United States Patent [19]
Bhan et al.

[11] Patent Number: 6,090,167
[45] Date of Patent: Jul. 18, 2000

[54] METHOD AND APPARATUS FOR IMPROVING FILM STABILITY OF HALOGEN-DOPED SILICON OXIDE FILMS

[75] Inventors: Mohan Krishan Bhan, Cupertino; Sudhakar Subrahmanyam, Sunnyvale; Anand Gupta, San Jose; Viren V. S. Rana, Los Gatos, all of Calif.

[73] Assignee: Applied Materials, Inc., Santa Clara, Calif.

[21] Appl. No.: 09/413,282

[22] Filed: Oct. 6, 1999

Related U.S. Application Data

[62] Division of application No. 08/616,707, Mar. 15, 1996, Pat. No. 6,001,728.

[51] Int. Cl.$^7$ .................................................. C23C 16/00
[52] U.S. Cl. ............. 29/25.01; 118/723 R; 118/723 AN; 118/723 MW; 118/723 I
[58] Field of Search ....................... 29/25.01; 118/723 R, 118/723 AN, 723 MW, 723 I

[56] References Cited

U.S. PATENT DOCUMENTS

| | | | |
|---|---|---|---|
| 4,894,352 | 1/1990 | Lane et al. | 437/238 |
| 5,045,346 | 9/1991 | Tabasky et al. | 427/39 |
| 5,068,124 | 11/1991 | Batey et al. | 427/39 |
| 5,413,967 | 5/1995 | Matsuda et al. | 437/235 |
| 5,456,796 | 10/1995 | Gupta et al. | 156/643.1 |
| 5,571,571 | 11/1996 | Musaka et al. | 427/574 |
| 5,571,578 | 11/1996 | Kaji et al. | 427/579 |
| 5,637,190 | 6/1997 | Liao | 438/726 |
| 5,643,640 | 7/1997 | Chakravarti et al. | 427/578 |
| 5,827,785 | 10/1998 | Bhan et al. | 438/784 |
| 6,001,728 | 12/1999 | Bhan | 438/624 |

OTHER PUBLICATIONS

R. Laxman et al., "Low ∈Dielectrics: CVD Fluorinated Silicon Dioxides," *Semiconductor International*, pp. 71, 72 and 74 (May 1995).
K. Musaka et al., "Single Step Gap Filling Technology for Subhalf Micron Metal Spacings on Plasma Enhanced TEOS/$O_2$ Chemical Vapor Deposition System," *Extended Abstracts of the 1993 International Conference on Solid State Devices and Materials*, pp. 510–512 (1993), no month.
D. Carl et al., "The Effect of $O_2$: $C_2F_6$ Ratios and Low Frequency Power on the Gap Fill Properties and Stability of F–TEOS Films," Feb. 21–22, 1995—*DUMIC Conference*, pp. 234–240 (Feb. 1995).
M.J. Shapiro et al., "Dual Frequency Plasma CVD Fluorosilicate Glass Water Absorption and Stability," Feb. 21–22, 1995—*DUMIC Conference*, pp. 118–123 (Feb. 1995).
S. Wolf, *Silicon Processing for the VLSI Era, vol. 2: Process Integration*, pp. 198–199 (1990), no month.

*Primary Examiner*—John F. Niebling
*Assistant Examiner*—Alexander G. Ghyka
*Attorney, Agent, or Firm*—Townsend & Townsend & Crew

[57] ABSTRACT

A method and apparatus for improving film stability of a halogen-doped silicon oxide layer. The method includes the step of introducing helium along with the process gas that includes silicon, oxygen and a halogen element. Helium is introduced at an increased rate to stabilize the deposited layer. In a preferred embodiment, the halogen-doped film is a fluorosilicate glass film and TEOS is employed as a source of silicon in the process gas. In still another preferred embodiment, $SiF_4$ is employed as the fluorine source for the FSG film.

15 Claims, 8 Drawing Sheets

6,090,167

METHOD AND APPARATUS FOR IMPROVING FILM STABILITY OF HALOGEN-DOPED SILICON OXIDE FILMS

CROSS-REFERENCE TO RELATED APPLICATIONS

This application is related to U.S. Ser. No. 08/538,696, filed Oct. 2, 1995 now abandoned, entitled "USE OF $SIF_4$ TO DEPOSIT F-DOPED FILMS OF GREATER STABILITY". The Ser. No. 08/538,696 application is assigned to Applied Materials Inc, the assignee of the present invention, and is hereby incorporated by reference. This application is a divisional of U.S. Ser. No. 08/616,707 filed Mar. 15, 1996, now U.S. Pat. No. 6,001,728.

BACKGROUND OF THE INVENTION

The present invention relates to the deposition of halogen-doped dielectric layers during wafer processing and more specifically to a method and apparatus for forming a halogen-doped layer having a low dielectric constant and high film stability.

One of the primary steps in the fabrication of modern semiconductor devices is the formation of a thin film on a semiconductor substrate by chemical reaction of gases. Such a deposition process is referred to as chemical vapor deposition or "CVD". Conventional thermal CVD processes supply reactive gases to the substrate surface where heat-induced chemical reactions produce a desired film. The high temperatures at which thermal CVD processes operate can damage device structures having metal layers. A common plasma enhanced CVD (PECVD) processes, on the other hand, promote disassociation of the reactant gases by the application of radio frequency (RF) energy to a reaction zone proximate to the substrate surface, thereby creating a plasma of highly reactive ionic species. The high reactivity of the released ionic species reduces the energy required for a chemical reaction to take place, and thus lowers the required temperature for such CVD processes. The relatively low temperature of a PECVD process makes such processes ideal for the formation of insulating layers over deposited metal layers and for the formation of other insulating layers.

Semiconductor device geometries have dramatically decreased in size since such devices were first introduced several decades ago. Since then, integrated circuits have generally followed the two year/half-size rule (often called "Moore's Law") which means that the number of devices which will fit on a chip doubles every two years. Today's wafer fabrication plants are routinely producing integrated circuits having 0.5 and even 0.35 micron feature sizes, and tomorrow's plants soon will be producing devices having even smaller geometries.

As device sizes become smaller and integration density increases, issues which were not previously considered important by the industry are becoming of concern. With the advent of multilevel metal technology in which three, four, or more layers of metal are formed on the semiconductors, one goal of semiconductor manufacturers is lowering the dielectric constant of insulating layers such as intermetal dielectric layers. Low dielectric constant films are particularly desirable for intermetal dielectric (IMD) layers to reduce the RC time delay of the interconnect metallization, to prevent cross-talk between the different levels of metallization, and to reduce device power consumption.

Many approaches to obtain lower dielectric constants have been proposed. One of the more promising solutions is the incorporation of fluorine or other halogen elements, such as chlorine or bromine, into a silicon oxide layer. In addition to the related application set forth above, another example of halogen incorporation is described in U.S. Ser. No. 08/548, 391 now abandoned entitled "METHOD AND APPARATUS FOR IMPROVING FILM STABILITY OF HALOGEN-DOPED SILICON OXIDE FILMS" and assigned to Applied Materials, Inc. The Ser. No. 08/548,391 application was filed on Oct. 25, 1995, and is hereby incorporated by reference for all purposes.

It is believed that fluorine, the preferred halogen dopant for silicon oxide films, lowers the dielectric constant of the silicon oxide film because fluorine is an electronegative atom that decreases the polarizability of the overall SiOF network. Fluorine-doped silicon oxide films are also referred to as fluoro silicate glass (FSG) films. The Ser. No. 08/548, 391 and 08/538,696 patent applications disclose FSG films deposited from a process gas that includes TEOS (Si $(OC_2H_5)_4$) mixed with a helium carrier gas, oxygen ($O_2$) and a fluorine source. Each application discloses introducing the helium carrier gas at a rate of between 400–1500 sccm, but neither application or other known prior art recognizes any notable benefits to introducing helium at a particular rate.

In addition to decreasing the dielectric constant, incorporating fluorine in intermetal silicon oxide layers also helps solve common problems encountered in fabricating smaller geometry devices, such as filling closely spaced gaps on semiconductor structures. Because fluorine is an etching species, it is believed that fluorine doping introduces an etching effect on the growing film. This simultaneous deposition/etching effect allows FSG films to have improved gap filling capabilities such that the films are able to adequately cover adjacent metal layers having an aspect ratio of 1.8 or more.

Thus, manufacturers desire to include fluorine in various dielectric layers and particularly in intermetal dielectric layers. One problem encountered in the deposition of FSG layers is film stability. Loosely bound fluorine atoms in the lattice structure of some FSG films result in the films' having a tendency to absorb moisture. The absorbed moisture increases the film's dielectric constant and can cause further problems when the film is exposed to a thermal process such as an anneal process. The high temperature of the thermal processes can move the absorbed water molecules and loosely bound fluorine atoms out of the oxide layer through metal or other subsequently deposited layers. The excursion of molecules and atoms in this manner is referred to as outgassing.

From the above, it can be seen that an oxide film having a low dielectric constant is necessary to keep pace with emerging technologies. It can also be seen that a method of increasing the stability of halogen-doped oxide films, thereby reducing moisture absorption and outgassing in the films, is desirable.

SUMMARY OF THE INVENTION

The present invention provides a halogen-doped layer having a low dielectric constant and unexpectedly improved stability. The invention also provides a method and apparatus for forming such a layer. Film stability is improved by introducing helium into the processing chamber at an elevated rate during plasma deposition. It is believed that the abundance of helium ions present in the plasma due to the increased helium flow, combined with the small size and light weight of the ions, has a sputtering effect on the growing film removing loosely bound atoms that would otherwise adversely affect film stability.

In one embodiment of the method of the present invention, a plasma is formed from a process gas to deposit a halogen-doped silicon oxide layer over a substrate in a processing chamber. The process gas includes silicon, oxygen, a halogen element and helium. Helium is introduced into the chamber at a selected rate to stabilize the deposited layer such that substantially no HF outgasses from the layer when its heated to a temperature of up to at least 450 degrees Celsius.

In a preferred embodiment of the method of the present invention, the process gas includes fluorine as the halogen element and an FSG layer is deposited over the substrate. In still another preferred embodiment, the process gas includes fluorine provided by $SiF_4$ and silicon provided by TEOS. $SiF_4$ is introduced at a rate sufficient to create a 2.5 percent $SiF_4$-FSG film, and the chamber is heated to between 400–450 degrees during deposition. The ratio at which helium is introduced relative to TEOS in this embodiment is at least 28.6 or greater.

These and other embodiments of the present invention, as well as its advantages and features are described in more detail in conjunction with the text below and the attached figures.

DETAILED DESCRIPTION OF THE PREFERRED EMBODIMENTS

I. Exemplary CVD Reactor Chamber

Figure 1:
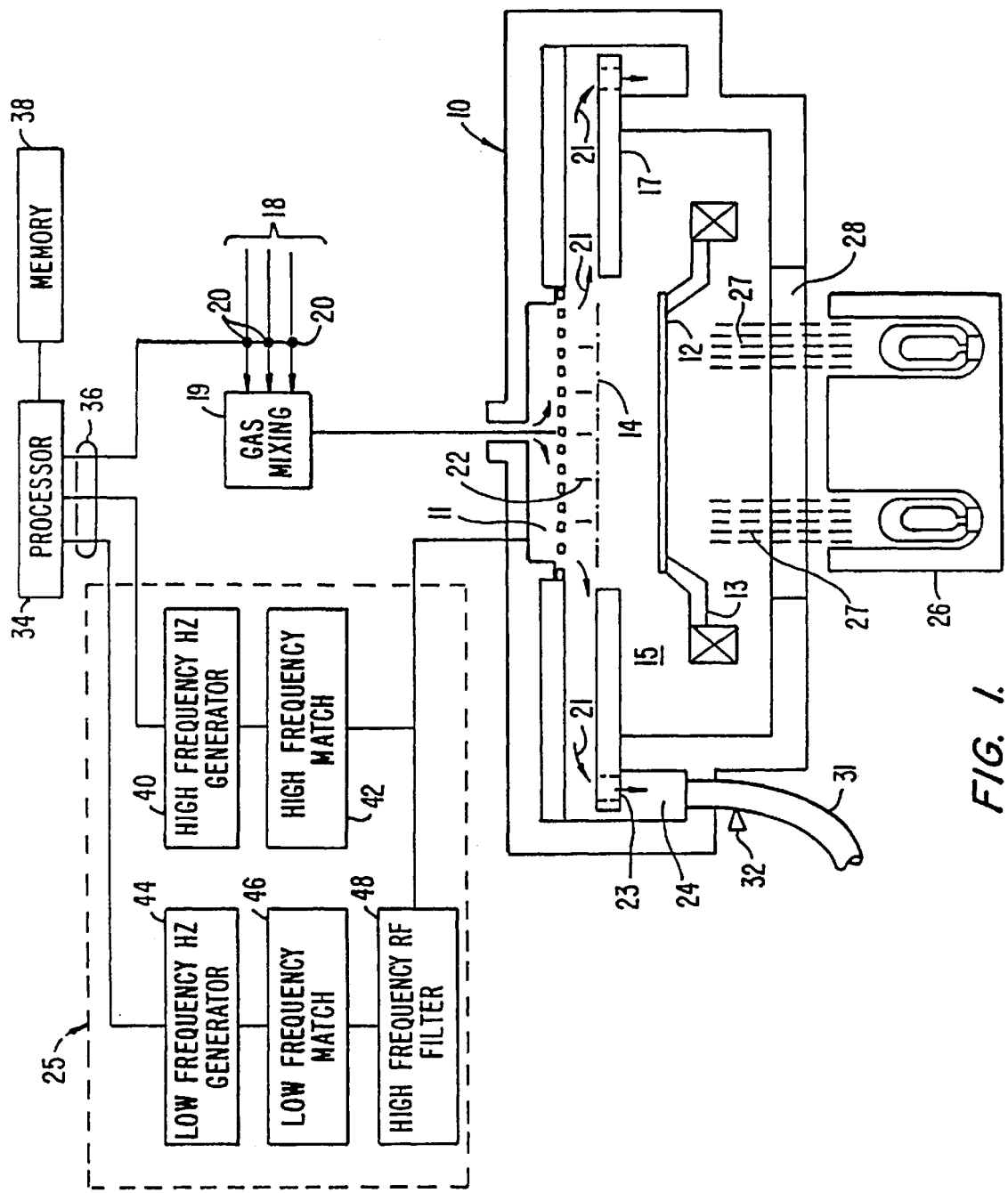
FIG. 1 is a vertical, cross-sectional view of one embodiment of a simplified chemical vapor deposition apparatus according to the present invention.

FIG. 1 illustrates one embodiment of a simplified, parallel-plate plasma enhanced chemical vapor deposition (PECVD) reactor 10 having a vacuum chamber 15 in which the dielectric layer according to the present invention can be deposited. Reactor 10 contains a gas distribution manifold 11 for dispersing deposition gases to a wafer, not shown, that rests on a susceptor 12. Susceptor 12 is highly thermally responsive and is mounted on support fingers 13 so that susceptor 12 (and the wafer supported on the upper surface of susceptor 12) can be controllably moved between a lower loading/off-loading position and an upper processing position 14 which is closely adjacent to manifold 11.

When susceptor 12 and the wafer are in processing position 14, they are surrounded by a baffle plate 17 having a plurality of spaced holes 23 which exhaust into an annular vacuum manifold 24. Deposition and carrier gases are supplied through gas lines 18 into a mixing chamber 19 where they are combined and then sent to manifold 11. During processing, gas supplied to manifold 11 is uniformly distributed radially across the surface of the wafer as indicated by arrows 21. The gas is then exhausted via ports 23 into the circular vacuum manifold 24 and out an exhaust line 31 by a vacuum pump system (not shown). The rate at which gases are released through exhaust line 31 is controlled by a throttle valve 32.

A controlled plasma is formed adjacent to the wafer by RF energy applied to manifold 11 from RF power supply 25. Gas distribution manifold 11 is also an RF electrode, while susceptor 12 is grounded. RF power supply 25 can supply either single or mixed frequency RF power (or other desired variations) to manifold 11 to enhance the decomposition of reactive species introduced into chamber 15. Mixed frequency RF power is generated by a high frequency (e.g., 13.56 MHz) RF generator 40 and corresponding match circuit 42 and a low frequency (e.g., 350 KHz) RF generator 44 and corresponding match circuit 46. A high frequency filter 48 prevents voltage generated by high frequency generator 40 from damaging the low frequency generator.

A circular external lamp module 26 provides a collimated annular pattern of light 27 through quartz window 28 onto an annular outer peripheral portion of susceptor 12. Such heat distribution compensates for the natural heat loss pattern of the susceptor and provides rapid thermal heating and uniform susceptor and wafer heating for effecting deposition.

A motor, not shown, raises and lowers susceptor 12 between a processing position 14 and a lower wafer-loading position. The motor, gas supply valves connected to gas lines 18, throttle valve 32 and RF power supply 25 are controlled by a processor 34 over control lines 36 of which only some are shown. Processor 34 operates under the control of a computer program stored in a memory 38. The computer program dictates the timing, mixture of gases, chamber pressure, chamber temperature, RF power levels, susceptor position, and other parameters of a particular process.

Typically, any or all of the chamber lining, gas inlet manifold faceplate, support fingers 13, and various other reactor hardware is fabricated from material such as aluminum or anodized aluminum. An example of such a PECVD apparatus is described in U.S. Pat. No. 5,000,113 entitled "Thermal CVD/PECVD Reactor and Use for Thermal Chemical Vapor Deposition of Silicon Dioxide and In-situ Multi-step Planarized Process," which is commonly assigned and is hereby incorporated by reference.

The above reactor description is mainly for illustrative purposes, and other plasma CVD equipment such as electron cyclotron resonance (ECR) plasma CVD devices, induction coupled RF high density plasma CVD devices, or the like may be employed. Additionally, variations of the above described system such as variations in susceptor design, heater design, RF power frequencies, location of RF power connections and others are possible. For example, the wafer could be supported and heated by a resistively heated susceptor. The layer and method for forming such a layer of the present invention is not limited to any specific apparatus or to any specific plasma excitation method.

II. Depositing Stable Halogen-doped Silicon Oxide Films

The present invention provides a conformal halogen-doped layer having a low dielectric constant, good gap-fill properties and high stability. Increased stability is obtained by introducing an inert gas, such as helium, into the chamber at an elevated rate during PECVD deposition. Experiments have unexpectedly determined that increasing the rate at which helium is introduced during deposition results in deposition of a stable film at even relatively high halogen incorporation levels. It is believed that the increased stability is primarily due to increased ion bombardment, which in turn, is caused by the increased helium flow and other factors as described in more detail below. It is believed that the increased ion bombardment removes loosely bonded atoms (e.g., F, OH, and weak Si—Si bonds) in the silicon oxide matrix that would otherwise decrease the stability of the halogen-doped layer. The helium dilution rate also provides a more stable plasma and increases the uniformity of the deposited film. Inert gases other than helium may also be used. For example, it is possible to use hydrogen, nitrogen or argon in different embodiments. Helium is used in preferred embodiments, however, because of its size and weight among other properties.

Figure 2:
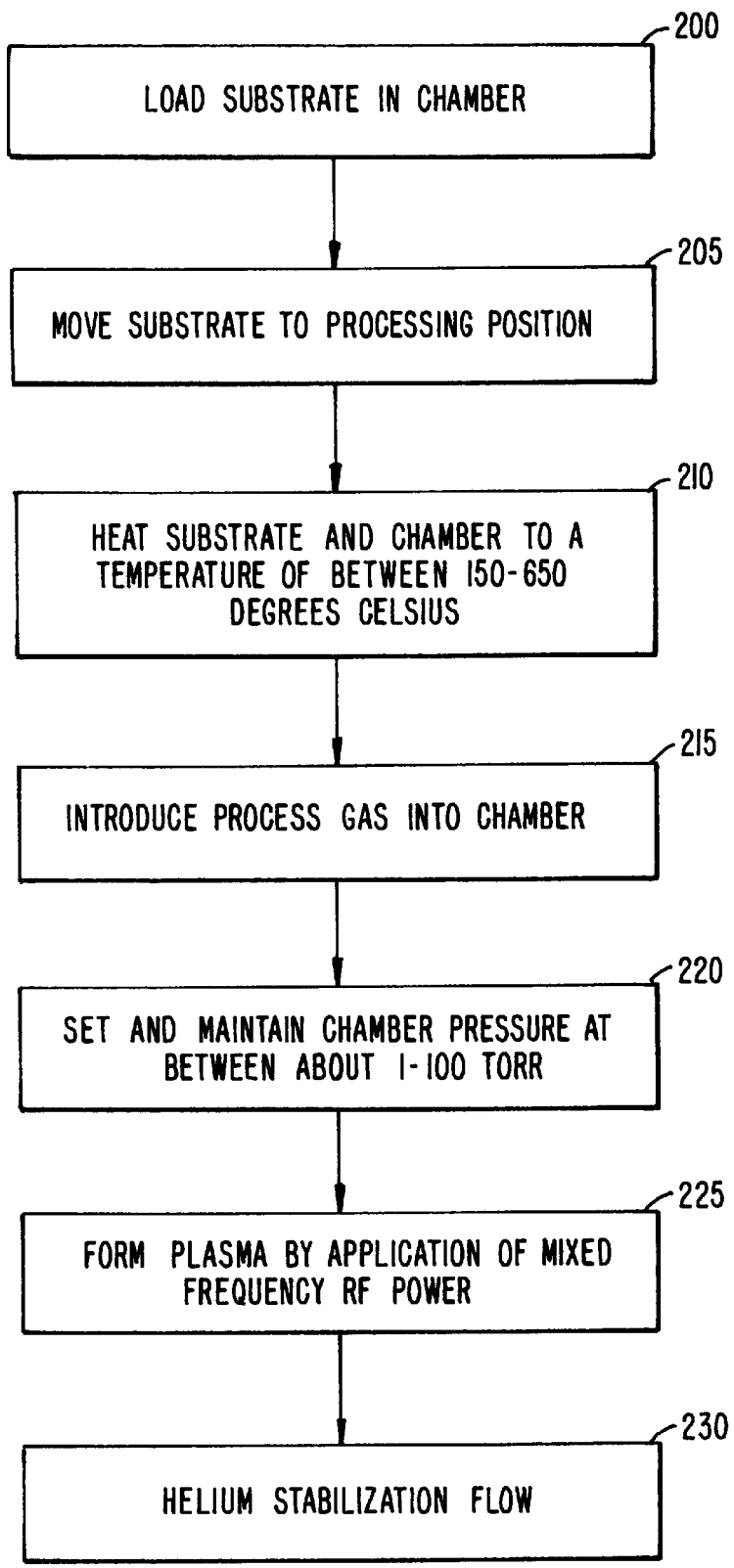
FIG. 2 is a flow chart illustrating process steps in the formation of a halogen-doped silicon oxide film according to an embodiment of the method of present invention.

To form the halogen-doped film according to the present invention, a wafer is loaded in vacuum chamber 15 through a vacuum-lock door and placed onto susceptor 12 (FIG. 2, step 200). The susceptor is then moved into processing position 14 (step 205). In processing position 14, the wafer is positioned between about 200–600 mils from gas distribution manifold 11.

Once the wafer is properly positioned, the wafer and susceptor are heated to a temperature of between 200–500° C. and a process gas is introduced into the reaction chamber from the gas distribution manifold (steps 210 and 215). The process gas includes silicon, oxygen, a halogen element and helium. Helium is introduced at an elevated rate as described in more detail below.

The increased helium flow may be introduced as a carrier gas for a reagent originating from a vaporized liquid such as TEOS, or, alternatively, helium may be introduced through a separate dedicated gas supply line. Use of a separate gas supply line provides more precise control of the rate at which helium is introduced into the chamber and is the method employed in some preferred embodiments of the present invention. In other embodiments, however, helium is introduced into the chamber through both a carrier gas line for vaporized TEOS and a second, separate gas line.

A selected pressure of between about 1–100 torr in the reaction chamber is set and maintained throughout deposition by throttle valve 32 in conjunction with the vacuum pump system and the introduction of the process gas (step 220). After processing conditions are set, a plasma is formed (step 225) using a mixed-frequency RF power supply. The plasma is maintained for a selected time to deposit a layer having a desired thickness.

The power supply is driven at a high frequency of between 13–14 MHz, preferably 13.56 MHz, at between 50–1200 Watts and at a low frequency of less than about 500 KHz, preferably about 350 KHz, at 100 Watts or more. The low frequency power supply controls ion bombardment during deposition of the film. Increasing the power at which the low frequency supply is driven, increases ion bombardment and further stabilizes the growing film. Thus, it is preferable that the lower frequency power supply be driven at 400 Watts or more, and if appropriate for a particular hardware configuration, it is even more preferable that the low frequency power supply be driven at about 800 Watts or greater.

After deposition is complete, the introduction of silicon, oxygen and the halogen element is stopped and the plasma is extinguished. Helium flow is maintained for an additional 10–120 seconds or longer to further stabilize the film (step 230). Preferably, helium flow is maintained for at least an additional 20 seconds. During this period, chamber temperature and pressure remain unchanged. It is believed that this helium-only flow step anneals the film, allowing some loosely bonded atoms to form stronger bonds and/or migrate from the deposited film. Once atoms outgas from the deposited film, the helium flow sweeps the outgassing atoms away so that they do not react or combine with other atoms at the film's surface to form additional loose bonds. It is possible to heat the chamber above the deposition temperature (e.g., up to 600 degrees) during this helium anneal step to further stabilize the film. Preferably, however, the chamber temperature is maintained at about 450 degrees or below so that deposited metal lines are not damaged.

As an alternative to step 215 where all constituents of the process gas are introduced simultaneously, preferred embodiments of the present invention introduce helium into the deposition chamber and form a plasma before TEOS and the halogen source are introduced. TEOS and the halogen source are then introduced after the plasma has reached full power as described in U.S. Ser. No. 08/599,270, entitled "METHOD AND APPARATUS FOR IMPROVING THE FILM QUALITY OF PLASMA ENHANCED CVD FILMS AT THE INTERFACE", filed on Feb. 9, 1996, and having Anand Gupta, Virendra V. S. Rana, Amrita Verma, Mohan K. Bhan and Sudhakar Subrahmanyam listed as inventors. The 08/599,270 application is assigned to Applied Materials, applicants for the present invention, and is hereby incorporated by reference for all purposes. Such a process sequence minimizes incomplete reactions that may occur between the reactant gases while the plasma is initiated and thus further improves the quality and stability of the film.

While a variety of different inert gases may be employed in the process gas, preferred embodiments of the present invention use helium as the inert gas. The size and weight of the helium atoms allows the atoms and ions to be controlled and rapidly accelerated by the low frequency RF power supply. It is believed that this phenomenon, combined with the large number of helium ions present in the plasma due to the increased rate of helium introduction, has a sputtering effect on the growing film removing loosely bonded atoms that would otherwise affect film stability. It is believed that the accelerated helium atoms and ions possess sufficient energy to dislodge loosely bonded atoms within the halogen-doped film, such as free fluorine, higher radicals of SiF, OH bonds, Si—OH bonds, weak Si—Si bonds, and others. Once dislodged, the atoms are swept away from the film surface by the helium flow so that they cannot react or combine with other atoms in the film.

The helium sputtering does not significantly affect other, more strongly bonded, atoms in the film matrix, such as strong SiF bonds. Thus, the growing film favors the formation of SiF bonding configurations. Since the loosely bonded atoms are the ones most likely to react with moisture and/or outgas during subsequent processing steps, removal of these atoms increases the stability of the film. Because of their small size, the accelerated helium ions and atoms also penetrate within the growing film to further remove loosely bonded atoms 20–30 Å or more beneath the film's surface.

The present invention seeks to maximize this helium sputtering effect by increasing the rate at which helium is introduced relative to other gases in the process gas. Also, preferred embodiments set process conditions to maximize the speed, and therefore the energy, of the helium ions in the plasma. The actual rate at which helium is introduced to provide a stable film depends on which constituents are used in the process gas, the chamber temperature, the halogen concentration and other factors. Examples including $SiF_4$-FSG and $C_2F_6$-FSG films are set forth below to help illustrate the present invention.

$SiF_4$ EXAMPLES

An $SiF_4$-FSG film may be deposited according to the present invention from a process gas that includes TEOS, a helium carrier gas, $O_2$ and $SiF_4$. TEOS, which is in liquid form at room temperature, is vaporized by a liquid injection valve or the like and combined with the helium carrier gas. When the exemplary $SiF_4$-FSG film is deposited in a lamp-heated DCVD chamber outfitted for 200 mm wafers in a P5000 Reactor manufactured by Applied Materials, the helium carrier gas is introduced into the processing chamber at a rate of at least about 1500 sccm. TEOS is introduced into the liquid injection valve at a rate of about 500 to 2000 mgm (equivalent to a net flow rate of 53.75 to 215 sccm) and $O_2$ is introduced into the chamber at a rate of about 200 to 1000 sccm. The rate at which $SiF_4$ is introduced into the chamber depends on the desired fluorine concentration of the FSG film, but will generally be between about 100–2500 sccm for films containing 0.5 to 5.0 percent $SiF_4$-FSG (as measured by Fourier transform infrared (FTIR) spectroscopy of the peak area ratio of SiF bonds to SiF+SiO bonds).

The rate at which helium is introduced to produce a stable $SiF_4$-FSG film in this exemplary process will vary with chamber temperature, $SiF_4$ percent, low frequency RF power, and chamber volume among other factors. In some embodiments, helium may be introduced into the chamber at a rate of less than 1500 sccm. The ratio of helium to TEOS in these and other embodiments, however, is preferably at least 9.30:1. More preferably, the ratio of helium to TEOS is about 15.25 or greater.

Experiments using the $SiF_4$, TEOS, $O_2$ and helium process gas produced a stable 2.5% $SiF_4$-FSG films at a temperature of 440° C. when the ratio of helium to TEOS was 0.85:1 or greater. In the experiments, helium was introduced at 1500 sccm while TEOS was introduced at 915 mgm (equivalent to a net flow rate of 98.36 sccm). $O_2$ was introduced at 600 sccm and $SiF_4$ was introduced at 550 sccm. Chamber pressure was set and maintained at 4 torr, the substrate was positioned 250 mils from the gas distribution manifold, and mixed frequency RF power was supplied at 13.56 MHz at 110 Watts and 350 KHz at 400 Watts.

FSG films that incorporate a higher percent of fluorine require introducing helium rate at an even higher rate to stabilize the film. Such higher percent fluorine films have a larger number of loosely bonded atoms to remove by helium sputtering. Experiments have determined that the ratio of helium to TEOS should be increased to 46.5:1 or more to produce a stable 5% $SiF_4$-FSG film at the above conditions. FSG films of between 2 to 3 percent $SiF_4$-FSG are required by some applications. At these fluorine concentration levels, the ratio of helium to TEOS should be at least 27.9 for a 400 degree process and at least 13.05 for a 440 degree process.

Increased ion bombardment can be controlled by decreasing chamber pressure, increasing low frequency RF power, decreasing the distance between the wafer and the gas distribution manifold and increasing chamber temperature among other possibilities. For example, experiments have determined that a stable 2.5% $SiF_4$-FSG film can be deposited at a temperature of 400° C. with an $SiF_4$ introduction rate of 750 sccm by introducing TEOS at 915 mgm and helium at 3000 sccm. Thus, in this example, a stable 2.5% $SiF_4$-FSG film was produced using a ratio of helium to TEOS of approximately 30.59. It is believed the helium flow required to stabilize a 2.5% $SiF_4$-FSG film at a deposition temperature of 440 degrees is lower than at 400 degrees because the higher deposition temperature increases ion bombardment of the film during plasma deposition. The increased ion bombardment enhances the helium sputtering effect thereby removing additional loosely bonded atoms from the film.

Further experiments have determined that stable 2.5% $SiF_4$-FSG films can be deposited at 200 and 500° C. by using a helium to TEOS ratio of 46.5 or greater and 13.59 or greater, respectively. Still further experiments have determined that film stability is increased by maintaining chamber pressure between 1–5 torr and susceptor spacing between 150–300 mils. Also, film stability is increased when the ratio of $O_2$ to TEOS is between 2.33–9.30:1. Preferably, the ratio of $O_2$ to TEOS is about 3.04:1.

$C_2F_6$ EXAMPLES

A stable $C_2F_6$-FSG film can be deposited according to the present invention from a process gas that includes TEOS, a helium carrier gas, $O_2$ and $C_2F_6$. The carbon in $C_2F_6$ is a source of additional impurities in this process that may result in loosely bonded atoms in the FSG matrix. Accordingly, the rate at which helium is introduced to stabilize a $C_2F_6$-FSG film of a particular fluorine concentration is generally higher than the rate at which it is introduced to stabilize an $SiF_4$-FSG film of a similar fluorine concentration. Experiments have determined that a helium to TEOS ratio of about 43.24:1 (4300 sccm to 925 mgm (99.44 sccm)) is required to stabilize a 2.5% $C_2F_6$-FSG film when chamber pressure is set at 5 torr, susceptor spacing at 300 mils and temperature at 440° C., $O_2$ was introduced into the chamber at 840 sccm for those experiments while $C_2F_6$ was introduced at 400 sccm. The plasma was formed using a high frequency of 13.56 MHz driven at 150 Watts and a low frequency of 350 KHz driven at 550 Watts. The experiments were performed in a resistively-heated DxZ chamber outfitted for 200 mm wafers in a P5000 Reactor System manufactured by Applied Materials.

Additional experiments determined that a stable 2.5% $C_2F_6$-FSG film can be deposited at 400° C. by increasing the rate at which helium is introduced to 5000 sccm so that the ratio of helium to TEOS is 50.27:1.

III. Test Results and Measurements

To show the effectiveness of the present invention, experiments were performed depositing various FSG films with and without the benefits of the method of the present invention.

A. $SiF_4$-FSG Deposition Experiments

The first set of these experiments compared a 2.5 percent $SiF_4$-FSG film (as measured by FTIR spectroscopy of the peak area ratio of SiF bonds to SiF+SiO bonds) deposited without the benefit of the present invention to a 2.5 percent $SiF_4$-FSG film deposited according to the method of the present invention. Both films were deposited over low-resistivity substrates in the above-mentioned lamp-heated DCVD chamber.

In the film deposited without the benefit of the present invention, the wafer was loaded into the processing chamber and moved into a processing position 250 mils from the gas distribution manifold. After being properly positioned, the wafer was heated to a temperature of 400° C. and a process gas including TEOS, helium, $O_2$ and $SiF_4$ was introduced into the chamber. Pressure within the chamber was set and maintained at 5 torr, and a plasma was formed using a high frequency of 13.56 MHz driven at 110 Watts and a low frequency of 350 KHz powered at 340 Watts. TEOS was introduced into the chamber at a rate of 915 mgm, vaporized using a liquid injection system and mixed with the helium carrier gas, which was introduced at a rate of 700 sccm. $O_2$ was introduced into the chamber at a rate of 700 sccm and $SiF_4$ was introduced at a rate of 725 sccm. The plasma was maintained until a 1.0 micron thick FSG layer was deposited.

In the film deposited according to the present invention, the wafer was also loaded into the processing chamber and moved into a processing position 250 mils from the gas distribution manifold. After the wafer was properly positioned, helium and oxygen gases were introduced into the chamber. Helium was introduced at an increased rate of 1500 sccm through a line connected to a liquid injection system used for TEOS introduction, and $O_2$ was introduced at a rate of 600 sccm. Next, the wafer was heated to a temperature of 440° C. and pressure within the chamber was set and maintained at 4 torr.

A plasma was then formed using a high frequency of 13.56 MHz driven at 110 Watts and a low frequency of 350 KHz powered at 400 Watts. After the RF power reached full power, vaporized TEOS was introduced at a rate of 915 mgm and combined with the helium carrier gas flow. $SiF_4$ was introduced two seconds later at a rate of 550 sccm. The plasma was maintained until a 1.0 micron thick FSG layer was deposited. A helium anneal step was performed for 60 seconds in the manner described above.

Figure 3A:
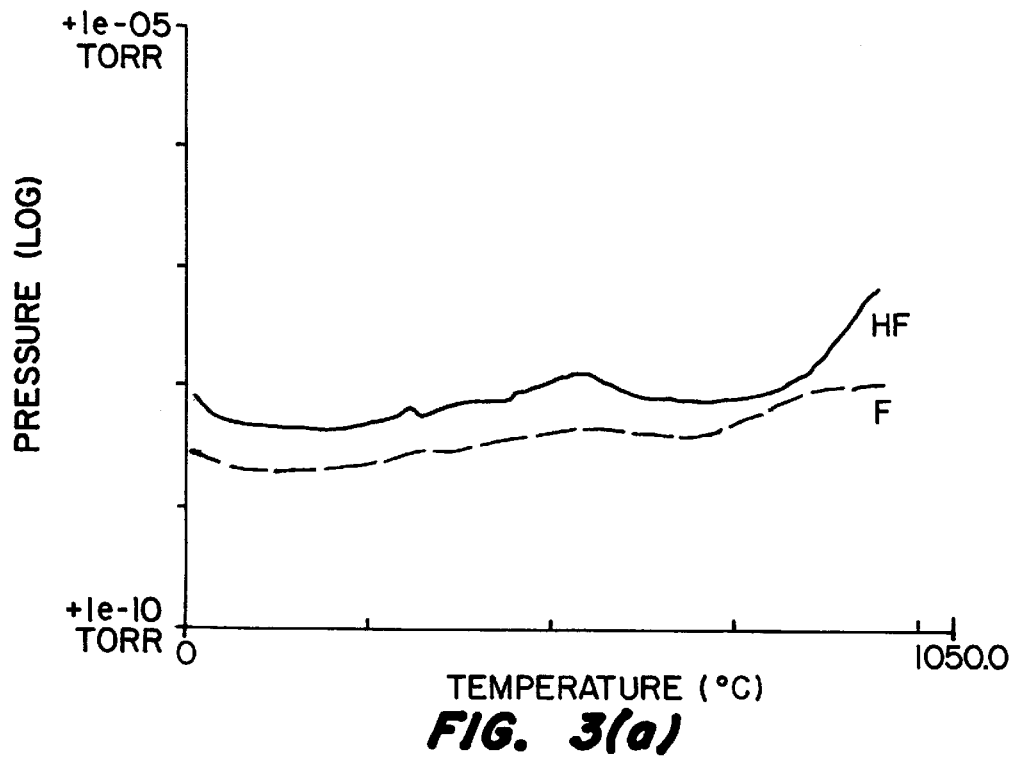
FIGS. 3(a) and 3(b) are graphs showing the evolution of fluorine (F) and hydrofluoric gas (HF) in $SiF_4$-FSG films deposited with and without the benefit of the present invention.
Figure 3B:
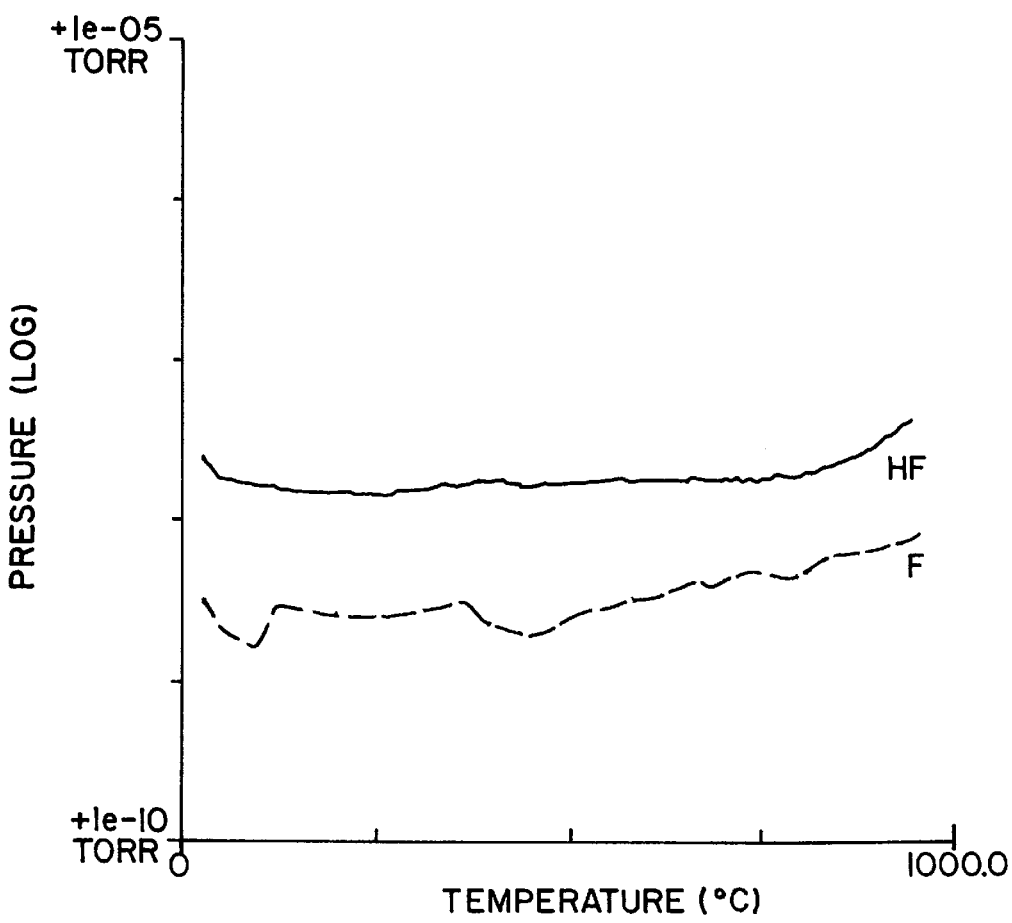

Thermal desorbtion spectrum data (TDS) indicating the evolution of HF (atomic weight 20) from each film is shown in FIGS. 3(a) and 3(b). FIG. 3(a) shows TDS data of F and HF for the $SiF_4$-FSG film deposited without the benefit of the present invention, while FIG. 3(b) shows TDS data of F and HF for the $SiF_4$-FSG film deposited according to the present invention. As evident from a comparison of FIG. 3(a) to FIG. 3(b), F and HF begin outgassing from the first film at around 275 and 325 degrees, respectively, while the film deposited according to the present invention is stable (e.g., substantially no F or HF outgassing) up to about at least 600 degrees. This difference is significant in that many thermal cycles take place at temperatures of between 400–450 degrees. It is important for some films to remain stable up to at least these temperatures. Such thermal cycles, which are particularly common for IMD layers, do not result in outgassing of F or HF in an FSG layer deposited according to the method of the present invention.

Figure 4A:
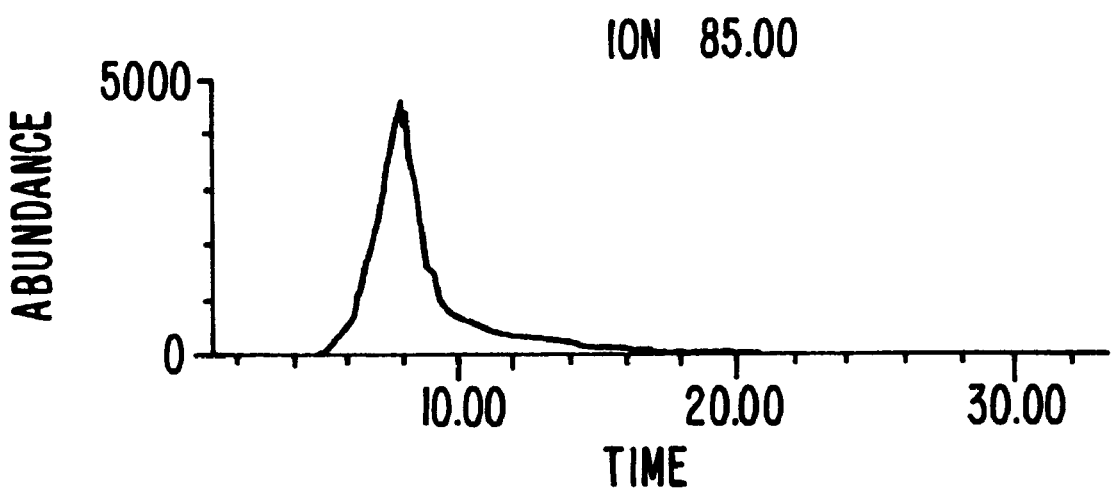
FIGS. 4(a) and 4(b) are graphs showing the evolution of $SiF_4$ from $SiF_4$-FSG films deposited with and without the benefit of the present invention.
Figure 4B:
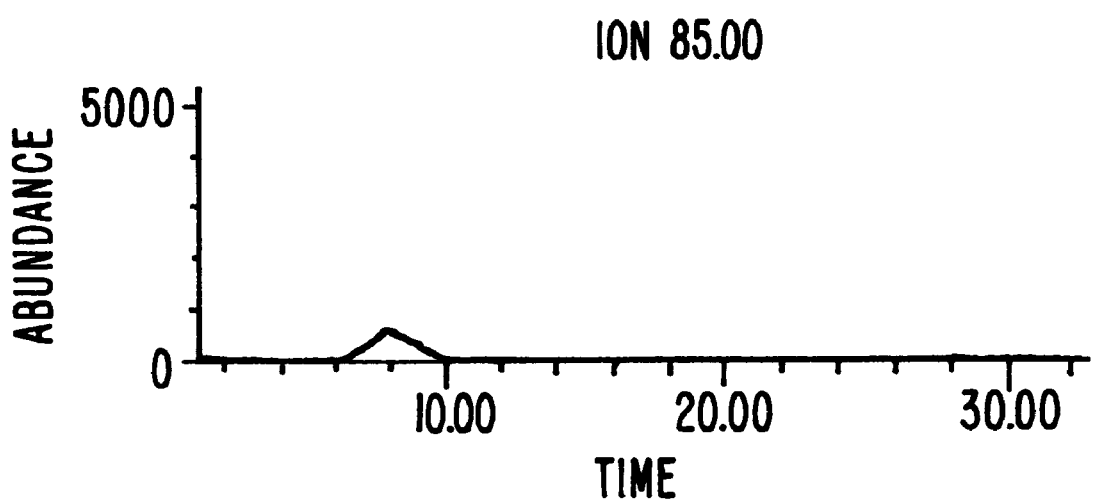

Further evidence of the benefits of the present invention is evident by a comparison of FIGS. 4(a) and 4(b), which illustrate the outgassing of $SiF_3$ from each film as determined by gas chromatography mass spectroscopy (GCMS) measurements. $SiF_3$ outgassing from the prior art film is shown in FIG. 4(a), while $SiF_3$ outgassing from the film deposited according to the present invention is shown in FIG. 4(b). The amount of $SiF_3$ outgassing ion in each figure is measured in arbitrary units, but the measurements illustrate the amount of outgassing $SiF_3$ ions in the film of FIG. 4(a) relative to the amount of outgassing $SiF_3$ ions in the film of FIG. 4(b). Thus, as shown in FIGS. 4(a) and 4(b), about five times as much $SiF_3$ was detected outgassing from the film deposited without the benefit of the present invention than from the film deposited according to the method of the present invention. It is believed that the better quality of the film deposited on the wafer tested for the results depicted in FIG. 6(b) is due to removal of loosely bonded atoms in the film by the increased helium flow.

Still further evidence of the stability of films deposited according to the present invention is shown in FIGS. 5(a), 5(b), 5(c), 5(d), 5(e) and 5(f) which are graphs of GCMS spectra data showing the evolution of $SiF_4$, $SiF_3$ ions, $SiF_2$ ions, SiF ions, HF and $H_2O$ respectively. The GCMS tests shown in FIGS. 5(a)–(f) were performed on the 2.5 percent $SiF_4$-FSG film deposited according to the present invention. Each test was performed by placing the substrate in a vacuum (approximately 2 millitorr) atmosphere and slowly heating the substrate from room temperature to 400° C. over an initial 10 minute period. The temperature was then maintained at 400 degrees for an additional 30 minutes before being slowly increased to 600 degrees during a subsequent 10 minute period. As shown in each of FIGS. 5(a)–(c), very little evolution of $SiF_4$, $SiF_3$ and $SiF_2$ occurred during the test, thus indicating the film was highly stable up to 600° C.

Figure 5A:
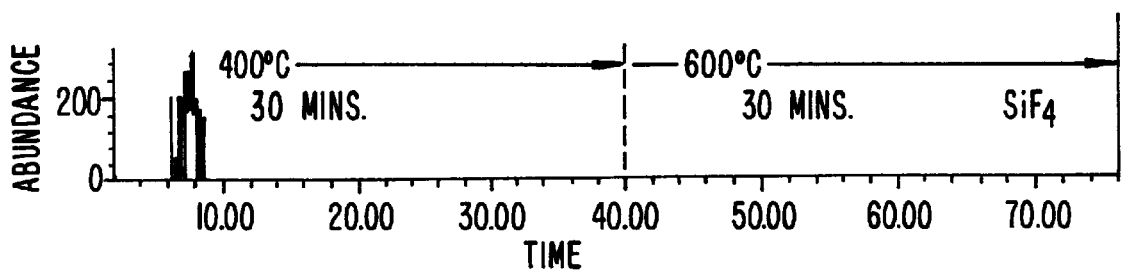
FIGS. 5(a), 5(b), 5(c), 5(d) and 5(e) are graphs showing the evolution of $SiF_4$, $SiF_3$, $SiF_2$, $SiF$ and $HF$ respectively, in a 2.5 percent $SiF_4$-FSG film deposited according to the present invention.
Figure 5B:
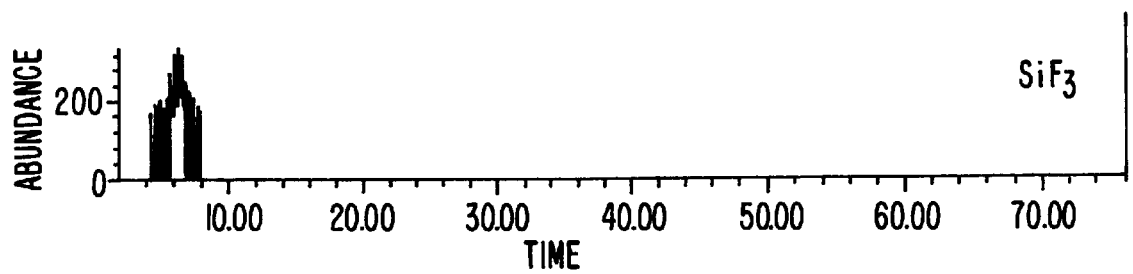
Figure 5C:
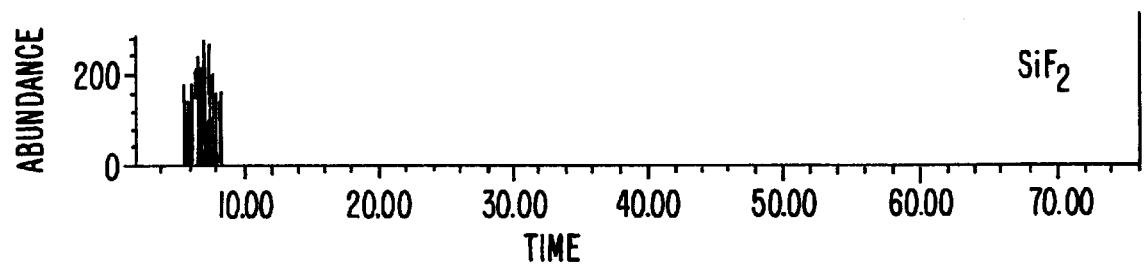
Figure 5D:
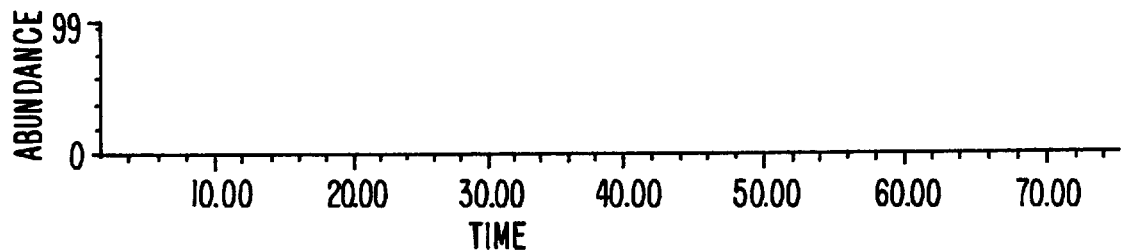
Figure 5E:
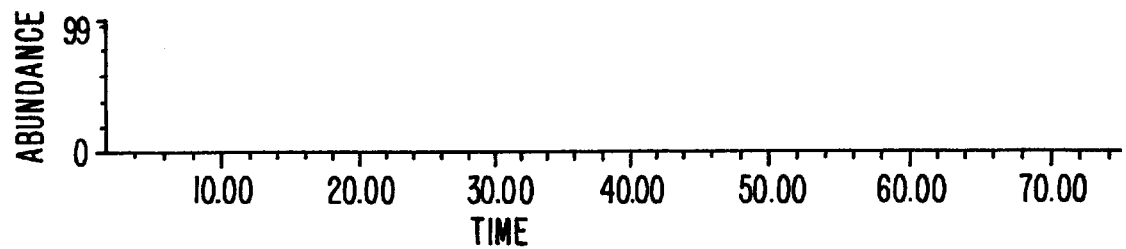
Figure 5F:
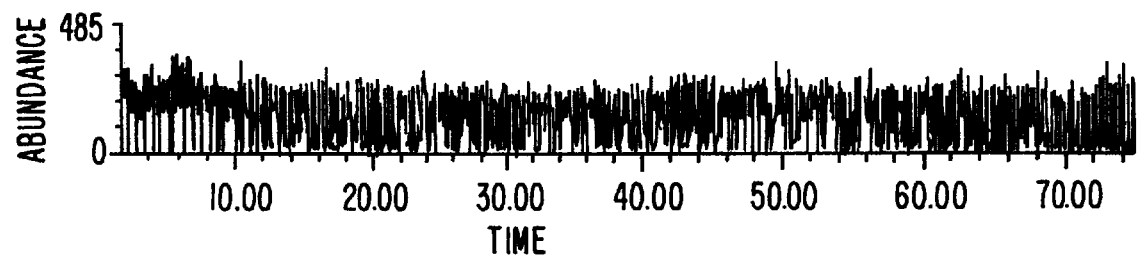
FIGS. 5(f) and 5(g) are graphs that indicate the evolution of $H_2O$ in a 2.5 percent $SiF_4$-FSG film deposited according to the present invention.
Figure 5G:
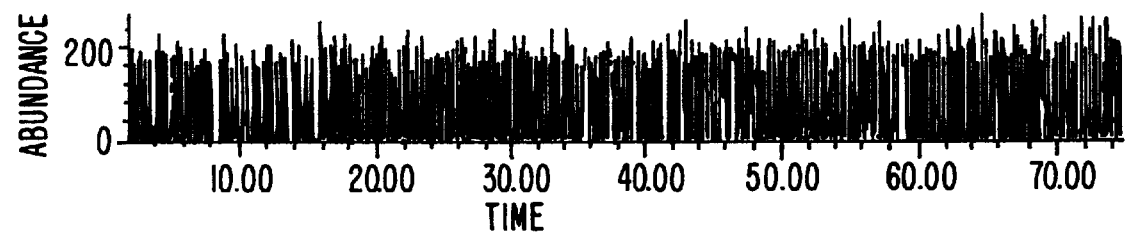

Additional GCMS measurements shown in FIGS. 5(d) and 5(e) indicate that there was no evidence of any significant evolution of SiF or HF at up to 600° C. during this test. FIG. 5(f) shows the GCMS measurements of the evolution of $H_2O$ during the test, and FIG. 5(g) shows GCMS measurements of $H_2O$ taken before the test as a measure of background moisture levels. As evident from a comparison of FIG. 5(f) to FIG. 5(g), there is no significant evolution of $H_2O$ from the film deposited according to the method of the present invention and the majority, if not all, of the measured $H_2O$ can be attributed to background moisture levels.

B. $C_2F_6$-FSG Experiments

The second set of these experiments compared a 2.5 percent $C_2F_6$-FSG film (as measured by FTIR spectroscopy of the peak area ratio of SiF bonds to SiF+SiO bonds) deposited without the benefit of the present invention to a 2.5 percent $C_2F_6$-FSG film deposited according to the method of the present invention. Both $C_2F_6$-FSG films were deposited in a resistively-heated DCVD chamber outfitted for 200 mm wafers in a P5000 Reactor manufactured by Applied Materials over a low-resistivity substrate.

In the film deposited without the benefit of the present invention, the wafer was loaded into the processing chamber and moved into a processing position 300 mils from the gas distribution manifold. After being properly positioned, the wafer was heated to a temperature of 400° C. and a process gas including TEOS, $O_2$ and $C_2F_6$ was introduced into the chamber. Pressure within the chamber was set and maintained at 5 torr, and a plasma was formed using a high frequency of 13.56 MHz driven at 150 Watts and a low frequency of 350 KHz powered at 550 Watts. TEOS was introduced into the chamber at a rate of 925 mgm, vaporized using a liquid injection system and mixed with a helium carrier gas introduced at a rate of 1500 sccm. $O_2$ was introduced into the chamber at a rate of 840 sccm and $C_2F_6$ was introduced at a rate of 400 sccm. The plasma was maintained until a 1.0 micron thick FSG layer was deposited.

In the film deposited according to the present invention, the wafer was also loaded into the processing chamber and moved into a processing position 300 mils from the gas distribution manifold. After the wafer was properly positioned, helium from two separate supply lines was introduced into the chamber. For the first supply line, helium was introduced at a rate of 2800 sccm through a line connected to a liquid injection system used for TEOS introduction, while on the second supply line helium was introduced at rate of 1500 sccm. The total helium introduction flow rate was 4300 sccm. The wafer was heated to a temperature of 440° C. and pressure within the chamber was set and maintained at 5 torr.

A plasma was then formed using a high frequency of 13.56 MHz driven at 150 Watts and a low frequency of 350 KHz powered at 550 Watts. After the RF power reached full power, vaporized TEOS was introduced at a rate of 925 mgm and combined with the first helium carrier gas flow. $C_2F_6$ was introduced five and a half seconds later at a rate of 360 sccm. The plasma was maintained until a 1.0 micron thick FSG layer was deposited. After deposition was completed, a helium anneal step was performed for 25 seconds.

Figure 6A:
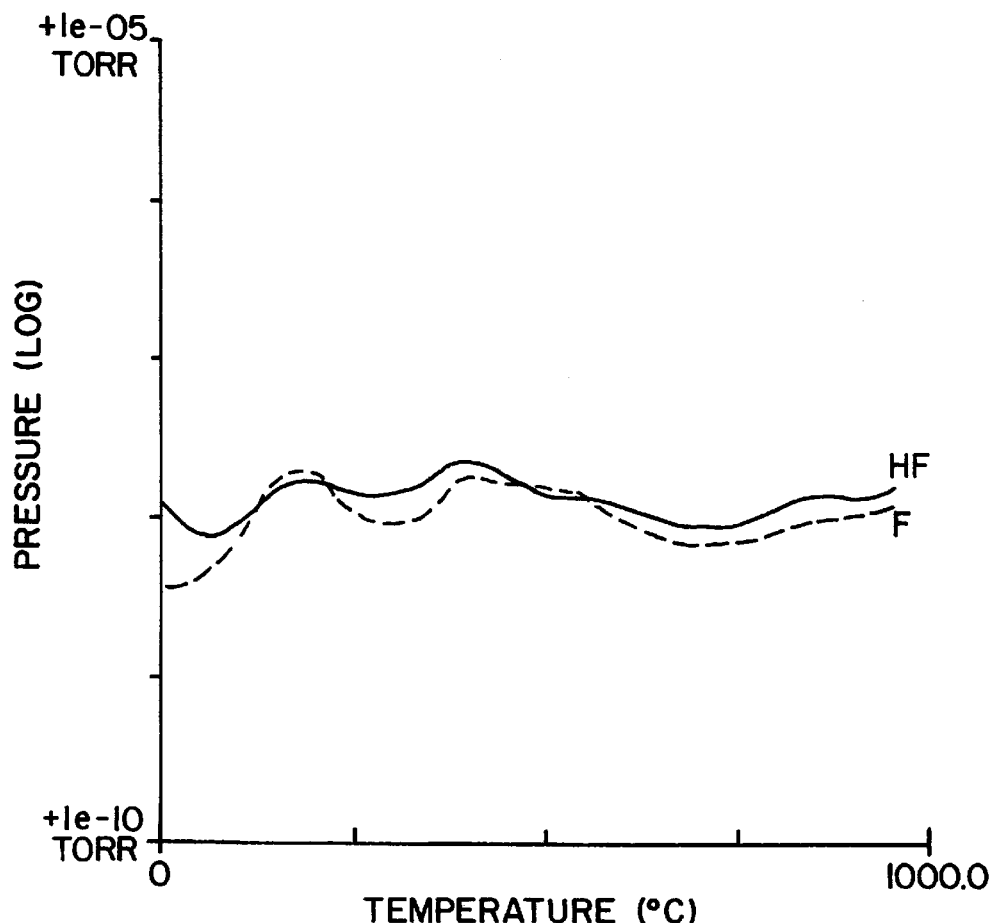
FIGS. 6(a) and 6(b) are graphs showing the evolution of F and HF in $C_2F_6$-FSG films deposited with and without the benefit of the present invention.
Figure 6B:
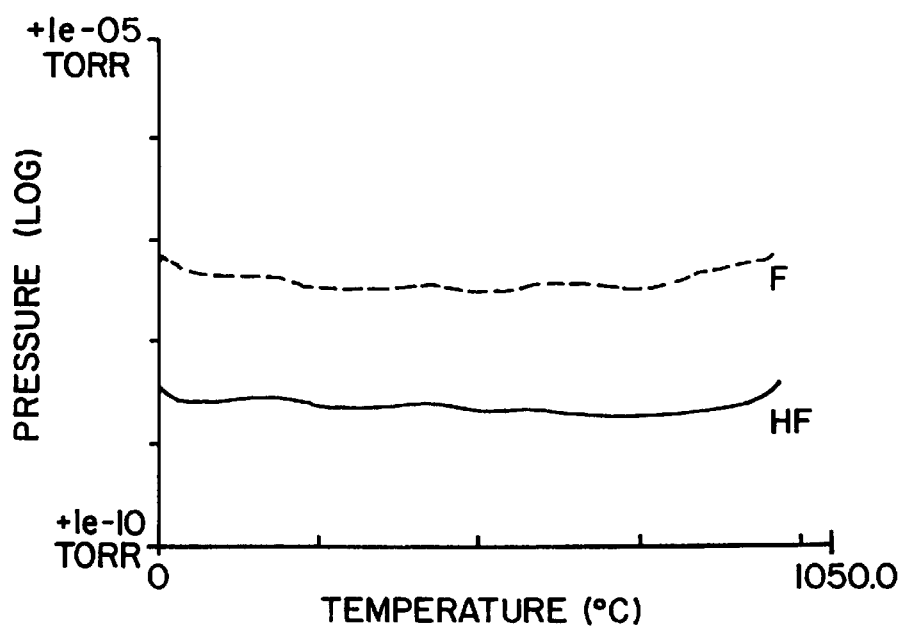

Thermal desorbtion data (TDS) showing the evolution of F and HF in each film is shown in FIGS. 6(a) and 6(b). FIG. 6(a) shows TDS data of F and HF for the $C_2F_6$-FSG film deposited without the benefit of the present invention, while FIG. 6(b) shows TDS data of F and HF for the $C_2F_6$-FSG film deposited according to the present invention. As evident from FIG. 6(a), F begins outgassing at very low temperatures from the first film while HF begins outgassing at around 125 degrees. In contrast, as shown in FIG. 6(b), the film deposited according to the present invention is stable up to at least about 600 degrees. As previously mentioned, this difference is significant in that many thermal cycles take place at temperatures of between 400–450 degrees. Such thermal cycles, which are particularly common for IMD layers, do not result in outgassing of F or HF in an FSG layer deposited according to the method of the present invention.

It is to be understood that the above examples and experiments are used for illustrative and exemplary purposes only and are not meant to limit the claims in any manner.

IV. Exemplary Structure

Figure 7:
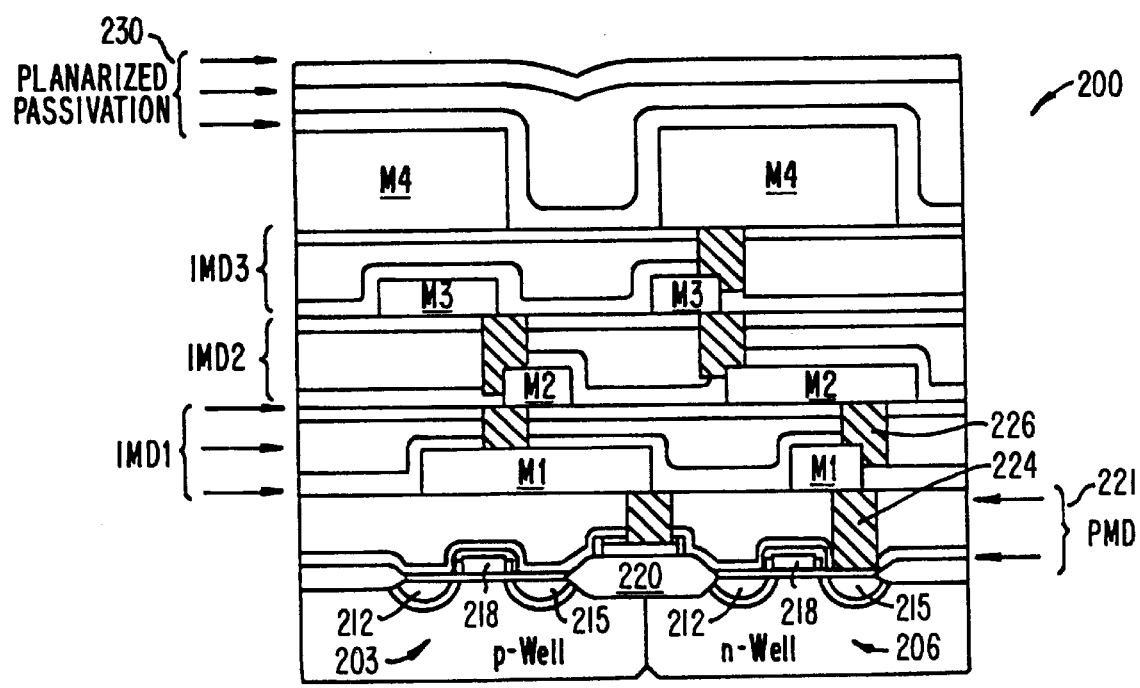
FIG. 7 is a simplified cross-sectional view of a semiconductor device manufactured according to the method of the present invention.

FIG. 7 illustrates a simplified cross-sectional view of a CMOS integrated circuit 200 according to the present invention. As shown, integrated circuit 200 includes NMOS and PMOS transistors 203 and 206, which are separated and electrically isolated from each other by a field oxide region 220. Each transistor 203 and 206 comprises a source region 212, a drain region 215 and a gate region 218.

A premetal dielectric layer 221 separates transistors 203 and 206 from metal layer M1 with connections between metal layer M1 and the transistors made by contacts 224. Metal layer M1 is one of four metal layers, M1–M4, included in integrated circuit 200. Each metal layer M1–M4 is separated from adjacent metal layers by respective intermetal dielectric layers IMD1, IMD2 or IMD3. Adjacent metal layers are connected at selected openings by vias 226. Deposited over metal layer M4 are planarized passivation layers 230.

While the dielectric layer of the present invention may find uses in each of the dielectric layers shown in integrated circuit 200, physical properties of the film, such as its low dielectric constant and good gap-fill properties, along with the PECVD process used in formation of the preferred embodiments, make it most useful as an insulation layer between adjacent metal layers as shown by IMD layers IMD1–IMD3. Typically, such IMD layers are between 0.2 and 3.0 microns thick.

The dielectric layer of the present invention may also be used in damascene layers which are included in some integrated circuits. In damascene layers, a blanket FSG layer is deposited over a substrate, selectively etched through to the substrate, and then filled with metal and etched back or polished to form metal contacts such as M1. After the metal layer is deposited, a second blanket FSG deposition is performed and selectively etched. The etched areas are then filled with metal and etched back or polished to form vias 226.

It should be understood that the simplified integrated circuit 200 is for illustrative purposes only. One of ordinary skill in the art could implement the present method for fabrication of other integrated circuits such as microprocessors, application specific integrated circuits (ASICS), memory devices, and the like. Additionally, the method of the present invention may be used in the fabrication of integrated circuits using technologies such as BiCMOS, NMOS, bipolar and others.

Having fully described several embodiments of the present invention, many other equivalent or alternative methods of depositing the low dielectric constant oxide layer according to the present invention will be apparent to those skilled in the art. For example, while illustrated embodiments concerned a process using TEOS as a source of silicon and $O_2$ as a source of oxygen, it is possible to use other silicon sources such as silane, and other oxygen sources such as $N_2O$, CO or others. Also, fluorine sources other than $SiF_4$ and $C_2F_6$ (e.g., TEFS) may be used. These alternatives and equivalents are intended to be included within the scope of the present invention.

What is claimed is:

1. A substrate processing system comprising:
   a housing for forming a vacuum chamber;
   a substrate holder, located within said housing, for holding a substrate;
   a gas distributor for introducing a process gas into said vacuum chamber to deposit a layer over said substrate;
   a gas mixing chamber, coupled to said gas distributor, in which a plurality of gases intermingle to form said process gas;
   a gas distribution system, coupled to said gas mixing chamber, for introducing said plurality of gases into said gas mixing chamber;
   a heater for heating said substrate;
   a vacuum system for setting and maintaining a pressure level within said vacuum chamber;
   an RF power supply to form a plasma from said process gas, said RF power supply capable of providing a first, high frequency RF power signal and a second, lower frequency RF power signal;
   a controller for controlling said gas distribution system, said heater, said RF power supply and said vacuum system; and
   a memory coupled to said controller and storing a program for directing operation of said chemical vapor deposition reactor system, said program including:
      a first set of instructions for controlling said heater to heat said substrate to a temperature of between about 200–500° C.;
      a second set of instructions for controlling said vacuum system to set and maintain said vacuum chamber at a pressure of between about 1–100 torr;
      a third set of instructions for controlling said gas distribution system to introduce gases comprising silicon, oxygen, a halogen and helium into said gas mixing chamber; and
      a fourth set of instructions for driving said first RF power signal at between about 25–500 Watts and for driving said second RF power signal at 100 Watts or above to form a plasma from said process gas and deposit said layer over said substrate;
   whereby said third set of instructions controls said gas distribution system to introduce helium into said chamber at a selected rate to stabilize said deposited layer such that substantially no HF outgasses from said layer when said layer is subsequently heated to a temperature of up to at least 450 degrees Celsius.

2. The substrate processing system of claim 1 wherein said third set of instructions controls said gas distribution system to introduce vaporized TEOS to provide said silicon into said gas mixing chamber.

3. The substrate processing system of claim 2 wherein said third set of instructions controls said gas distribution system to introduce $SiF_4$ to provide said halogen into said gas mixing chamber.

4. The substrate processing system of claim 3 wherein said program includes instructions that control said gas distribution system, said heater, said vacuum system and said RF generators to deposit an FSG film containing at least 2% $SiF_4$-FSG.

5. The substrate processing system of claim 2 wherein said third set of instructions controls said gas distribution system to introduce $C_2F_6$ to provide said halogen into said gas mixing chamber.

6. A substrate processing system comprising:
   a housing that forms a chamber;
   a gas distribution system configured to introduce gases into said chamber;
   a plasma formation system operatively coupled to said chamber to form a plasma within said chamber, said plasma formation system capable of generating a first, high frequency RF power signal and a second, lower frequency RF power signal;
   a controller that controls said gas distribution system, and said plasma formation system; and
   a memory coupled to said controller and storing a computer-readable-program therein that directs operation of said substrate processing system, said computer-readable program including:
      computer instructions for controlling said gas distribution system to flow a process gas comprising silicon, oxygen, fluorine and an inert gas into said chamber; and
      computer instructions for controlling said plasma generation system to provide said first and second RF power signals to said chamber to form a plasma within said chamber from said process gas and deposit a layer over a substrate disposed within said chamber;
      wherein computer instructions for controlling said gas distribution system flow said inert gas into said chamber at a selected rate sufficient to stabilize said deposited layer such that substantially no HF outgasses from said deposited layer when it is heated up to at least 400 degrees Celsius during thermal desorbtion data testing.

7. The substrate processing system of claim 6 wherein said inert gas is helium.

8. The substrate processing system of claim 7 wherein said silicon is provided by flowing TEOS into said chamber.

9. The substrate processing system of claim 8 wherein fluorine is provided by $SiF_4$ and said computer instructions control said gas distribution system to flow helium and TEOS into said chamber at a ratio of at least 13.05:1.

10. The substrate processing system of claim 7 wherein fluorine is provided by $SiF_4$ and said computer instructions control said gas distribution system to flow helium into said chamber at a rate of 1500 sccm or greater.

11. The substrate processing system of claim 7 wherein said fluorine is provided by $C_2F_6$ and said computer instructions control said gas distribution system to flow helium and TEOS into said chamber at a ratio of at least 43.24:1.

12. The substrate processing system of claim 7 wherein said fluorine is provided by $SiF_4$ and said computer instructions control said gas distribution system to flow helium into said chamber at a rate of 4000 sccm or greater.

13. A substrate processing system comprising:
   a housing that forms a chamber;
   a gas distribution system configured to introduce gases into said chamber;
   a plasma formation system operatively coupled to said chamber to form a plasma within said chamber, said plasma formation system capable of generating a first, high frequency RF power signal and a second, lower frequency RF power signal;
   a controller that controls said gas distribution system, and said plasma formation system; and
   a memory coupled to said controller and storing a computer-readable-program therein that directs operation of said substrate processing system, said computer-readable program including:
      computer instructions for controlling said gas distribution system to flow a process gas comprising silicon, oxygen, a halogen element and helium into said chamber; and
      computer instructions for controlling said plasma generation system to provide said first and second RF power signals to said chamber to form a plasma within said chamber from said process gas and deposit a layer over a substrate disposed within said chamber; and
      computer instructions for controlling said gas distribution system and said plasma generation system to stop the flows of said silicon, oxygen and said halogen element and substantially concurrently extinguish said plasma while maintaining helium flow into said chamber for at least 10 seconds after said plasma is extinguished.

14. The substrate processing system of claim 13 wherein said computer instructions control said gas distribution system to flow helium for at least 20 seconds after said plasma is extinguished.

15. The substrate processing system of claim 13 wherein said computer instructions control said gas distribution system to flow helium at a rate of at least 1500 sccm after said flows of said silicon, oxygen and said halogen element are stopped.

* * * * *